United States Patent
Zhao et al.

(10) Patent No.: US 11,289,512 B2
(45) Date of Patent: Mar. 29, 2022

(54) SUBSTRATE AND MANUFACTURING METHOD THEREOF, DISPLAY PANEL AND DISPLAY DEVICE

(71) Applicants: BOE Technology Group Co., Ltd., Beijing (CN); Hefei BOE Optoelectronics Technology Co., Ltd., Anhui (CN)

(72) Inventors: Na Zhao, Beijing (CN); Liyun Deng, Beijing (CN)

(73) Assignees: BOE Technology Group Co., Ltd., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 751 days.

(21) Appl. No.: 16/080,254

(22) PCT Filed: Dec. 15, 2017

(86) PCT No.: PCT/CN2017/116468
§ 371 (c)(1),
(2) Date: Aug. 27, 2018

(87) PCT Pub. No.: WO2018/171268
PCT Pub. Date: Sep. 27, 2018

(65) Prior Publication Data
US 2021/0193693 A1    Jun. 24, 2021

(30) Foreign Application Priority Data

Mar. 20, 2017   (CN) .......................... 201710166225.8

(51) Int. Cl.
*H01L 27/12*    (2006.01)
*G02F 1/1339*   (2006.01)
*H01L 51/52*    (2006.01)

(52) U.S. Cl.
CPC ........ *H01L 27/1218* (2013.01); *H01L 27/124* (2013.01); *H01L 27/1262* (2013.01); *G02F 1/1339* (2013.01); *H01L 51/5253* (2013.01)

(58) Field of Classification Search
CPC .............. H01L 27/1218; H01L 27/124; H01L 27/1262; H01L 51/5253; G02F 1/1339
(Continued)

(56) References Cited

U.S. PATENT DOCUMENTS

2002/0030769 A1    3/2002  Bae
2003/0122977 A1    7/2003  Shin et al.
(Continued)

FOREIGN PATENT DOCUMENTS

CN    101393363 A    3/2009
CN    101556417 A    10/2009
(Continued)

OTHER PUBLICATIONS

Apr. 10, 2019—(CN) First Office Action Appn 201710166225.8 with English Translation.
(Continued)

*Primary Examiner* — Dzung Tran
(74) *Attorney, Agent, or Firm* — Banner & Witcoff, Ltd.

(57) ABSTRACT

A substrate includes: a base substrate, a thin film transistor disposed on the base substrate, an organic insulating layer disposed on the thin film transistor, an inorganic passivation layer disposed on the organic insulating layer, and at least a portion of the organic insulating layer which is in contact with the inorganic passivation layer is provided with a concave-convex structure.

11 Claims, 5 Drawing Sheets

(58) Field of Classification Search
USPC .......................................................... 257/79
See application file for complete search history.

(56) References Cited

U.S. PATENT DOCUMENTS

| | | | |
|---|---|---|---|
| 2004/0125288 A1* | 7/2004 | Jeong | G02F 1/133553 349/113 |
| 2004/0135943 A1 | 7/2004 | Kang et al. | |
| 2004/0239845 A1* | 12/2004 | Choi | G02F 1/133553 349/113 |
| 2007/0057260 A1* | 3/2007 | Lee | H01L 27/1248 257/72 |
| 2007/0085939 A1 | 4/2007 | You | |
| 2012/0112225 A1* | 5/2012 | Le Bellac | H01L 51/5268 257/98 |
| 2013/0264595 A1* | 10/2013 | Hong | G02B 26/005 257/91 |

FOREIGN PATENT DOCUMENTS

| | | |
|---|---|---|
| CN | 203084388 U | 7/2013 |
| CN | 105867697 A | 8/2016 |
| CN | 106898617 A | 6/2017 |
| GN | 1953186 A | 4/2007 |
| KR | 20020091695 A | 12/2002 |

OTHER PUBLICATIONS

Mar. 15, 2018—(WO) International Search Report and Written Opinion Appn PCT/CN2017/116468 with English Translation.

\* cited by examiner

SUBSTRATE AND MANUFACTURING METHOD THEREOF, DISPLAY PANEL AND DISPLAY DEVICE

The application is a U.S. National Phase Entry of International Application No. PCT/CN2017/116468 filed on Dec. 15, 2017, designating the United States of America and claiming priority to Chinese Patent Application No. 201710166225.8 filed on Mar. 20, 2017. The present application claims priority to and the benefit of the above-identified applications and the above-identified applications are incorporated by reference herein in their entirety.

TECHNICAL FIELD

Embodiments of the present disclosure relate to a substrate and its manufacturing method, a display panel and a display device.

BACKGROUND

In a field of display technology, with the development of display technology and the user's increasing demand for visual experience, more and more attention has been paid to display devices with a high resolution and a low power consumption.

In general, in order to reduce the power consumption of display devices, an organic insulating layer is arranged between electrodes that are provided in a stack manner, between electrode lines that are provided in the stack manner and between the electrode and the electrode line that are provided in the stack manner. A distance between the electrodes, a distance between the electrode lines and a distance between the electrode and the electrode line are increased by adding the organic insulating layer, thus a parasitic capacitance is reduced, and thus the power consumption of the display device is reduced.

SUMMARY

At least one embodiment of the present disclosure provides a substrate, and the substrate includes: a base substrate; a thin film transistor disposed on the base substrate; an organic insulating layer and an inorganic passivation layer which are disposed on the thin film transistor in sequence, at least a portion of the organic insulating layer which is in contact with the inorganic passivation layer is provided with a concave-convex structure.

For example, in the substrate provided by at least one embodiment of the present disclosure, the concave-convex structure comprises a concave structure.

For example, in the substrate provided by at least one embodiment of the present disclosure, the organic insulating layer is provided with a via hole structure for electrical connection, and at least a portion of the organic insulating layer which is in contact with the inorganic passivation layer and at a peripheral region of the via hole structure is provided with the concave structure.

For example, in the substrate provided by at least one embodiment of the present disclosure, the concave structure is arranged at a preset distance from the via hole structure.

For example, in the substrate provided by at least one embodiment of the present disclosure, the concave-convex structure comprises a plurality of the concave structures, the plurality of the concave structures are evenly arranged on a surface of the organic insulating layer.

For example, in the substrate provided by at least one embodiment of the present disclosure, the concave-convex structure comprises a plurality of the concave structures, the farther the concave structures are from the via hole structure, the greater a density of the concave structures is.

For example, in the substrate provided by at least one embodiment of the present disclosure, the concave-convex structure comprises a plurality of the concave structures, the farther the concave structures are from the via hole structure, the larger areas of horizontal sections of the concave structures are.

For example, in the substrate provided by at least one embodiment of the present disclosure, the via hole structure penetrates through the organic insulating layer, a ratio of a size of the concave structure in a direction perpendicular to the base substrate to a size of the via hole structure in the direction perpendicular to the base substrate is from ¼ to ½.

For example, in the substrate provided by at least one embodiment of the present disclosure, a shape of a longitudinal section of the concave structure comprises at least one of a semi-circle, a semi-ellipse, a rectangle and a trapezoid.

For example, in the substrate provided by at least one embodiment of the present disclosure, a first electrode is arranged between the organic insulating layer and the inorganic passivation layer, and the first electrode is electrically coupled with a drain electrode of the thin film transistor by the via hole structure.

For example, in the substrate provided by at least one embodiment of the present disclosure, a material of the organic insulating layer comprises at least one of polyimide, tetrafluoroethylene-perfluoroalkoxy vinyl ether copolymer, acrylic resin and polybutylene terephthalate.

For example, the substrate provided by at least one embodiment of the present disclosure further includes a second electrode arranged on the inorganic passivation layer, and the first electrode is a pixel electrode, and the second electrode is a common electrode.

For example, the substrate provided by at least one embodiment of the present disclosure further includes a gate line and a data line arranged on the base substrate, and the gate line and the data line are intersected with each other to define a pixel region, and the thin film transistor is arranged in the pixel region.

At least one embodiment of the present disclosure further provides a display panel, and the display panel includes any one of the substrates described above.

At least one embodiment of the present disclosure further provides a display device, and the display device includes any one of the display panel described above.

At least one embodiment of the present disclosure further provides a manufacturing method of a substrate, and the manufacturing method includes: providing a base substrate; forming a thin film transistor on the base substrate; forming an organic insulating layer and an inorganic passivation layer on the thin film transistors in sequence; at least a portion of the organic insulating layer which is in contact with the inorganic passivation layer is provided with a concave-convex structure.

For example, the manufacturing method provided by at least one embodiment of the present disclosure, further includes: forming a gate line and a data line on the base substrate, the gate line and the data line are intersected with each other to define a pixel region, and the thin film transistor is arranged in the pixel region.

BRIEF DESCRIPTION OF THE DRAWINGS

In order to clearly illustrate the technical solution of the embodiments of the disclosure, the drawings of the embodi

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "coupled", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Figure 1:
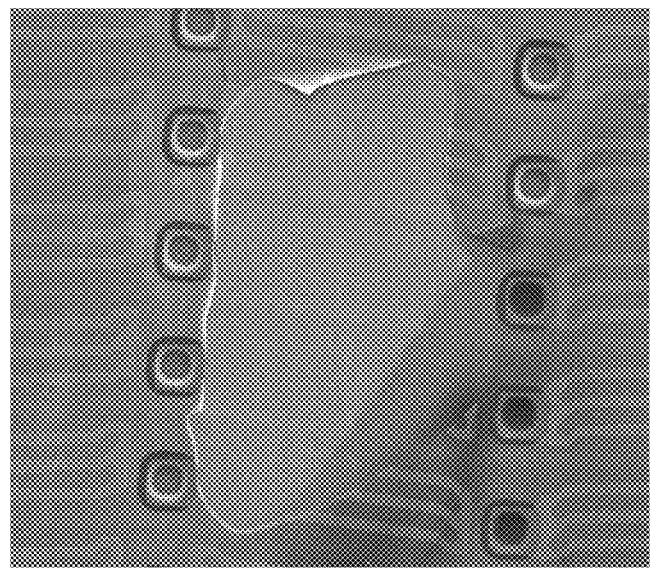
- FIG. 1 is a scanning electron microscope diagram illustrating that a part of layers falls off.

In a process of manufacturing display devices, in order to reduce the power consumption of the display devices and to improve the resolution of the display devices, an organic insulating layer for example is disposed between electrodes that are provided in a stack manner, between electrode lines that are provided in the stack manner and between the electrode and the electrode line that are provided in the stack manner to increase a distance between the electrodes, a distance between the electrode lines and a distance between the electrode and the electrode line, thus a parasitic capacitance is reduced, and therefore the power consumption of each of the display devices is reduced. An inorganic passivation layer for example is further provided on a surface of the organic insulating layer to further reduce the power consumption and to prevent exposed metal lines and metal electrodes from being oxidized. However, after the organic insulating layer and the inorganic passivation layer are formed, the solvent in the organic insulating layer volatilizes during the subsequent high temperature treatment; in this way, the inorganic passivation layer formed on the organic insulating layer easily falls off from the organic insulating layer, which leads to poor display effect of the display device. The inventors of the present disclosure found that regions where the inorganic passivation layer easily falls off are not regions where via hole structures are located, but peripheral regions of the via hole structures. For example, FIG. 1 is a scanning electron microscope diagram illustrating that a part of layers falls off; as illustrated in FIG. 1, the falling off of the inorganic passivation layer and the falling off of an electrode layer formed on the inorganic passivation layer are more seriously between the via hole structures, and the falling off of the inorganic passivation layer between the via hole structures are reduced by changing the structure of the organic insulating layer at the peripheral regions of the via hole structures.

At least one embodiment of the present disclosure provides a substrate, and the substrate includes: a base substrate; a thin film transistor disposed on the base substrate; and an organic insulating layer and an inorganic passivation layer which are disposed on the thin film transistor in sequence, and at least a portion of the organic insulating layer which is in contact with the inorganic passivation layer is provided with a concave-convex structure.

In at least one embodiment of the present disclosure, at least the portion of the organic insulating layer which is in contact with the inorganic passivation layer is provided with the concave-convex structure to increase the contact area between the inorganic passivation layer and the organic insulating layer. Thus, the internal stress of the inorganic passivation layer which is easy to cause cracks of the inorganic passivation layer is released, and further the phenomenon that the inorganic passivation layer falls off is reduced or eliminated.

Figure 2:
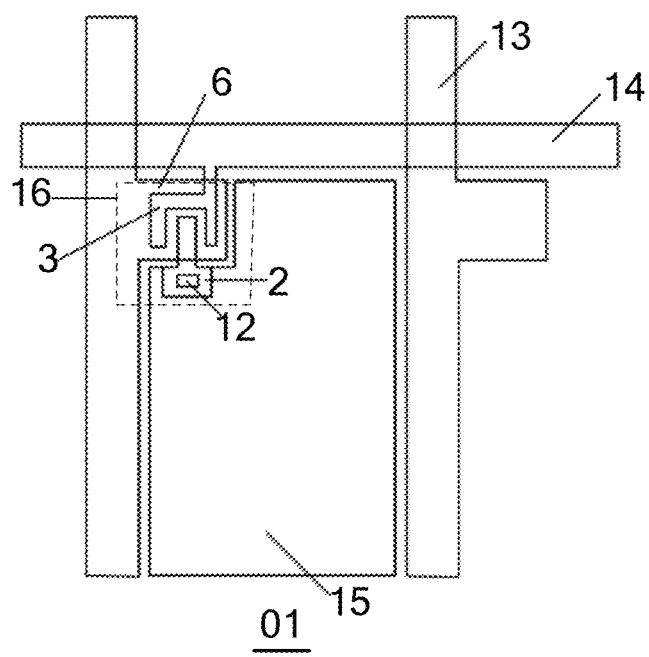
FIG. 2 is a schematic diagram of a planar structure of a substrate provided by at least one embodiment of the present disclosure.
Figure 3:
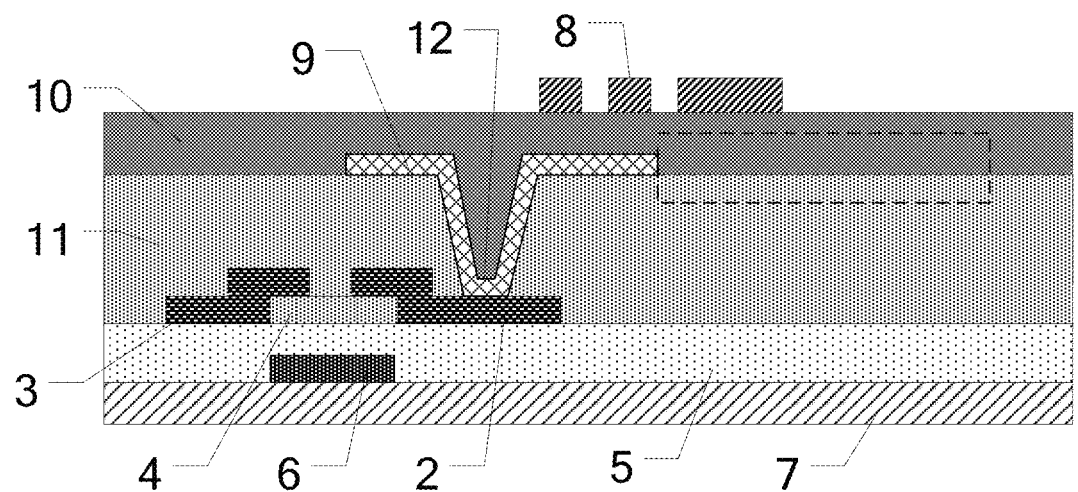
FIG. 3 is a schematic diagram of a sectional structure of the substrate provided by at least one embodiment of the present disclosure.

At least one embodiment of the present disclosure provides the substrate, for example, FIG. 2 is a schematic diagram of a planar structure of the substrate provided by at least one embodiment of the present disclosure, FIG. 3 is a schematic diagram of a sectional structure of the substrate provided by at least one embodiment of the present disclosure. As illustrated in FIG. 2 and FIG. 3, the substrate 01 includes: a base substrate 7; a gate line 13 and a data line 14 arranged on the base substrate 7, in which the gate line 13 and the data line 14 are crossed with each other to define a pixel region 15, and a thin film transistor 16 is arranged in the pixel region 15; an organic insulating layer 11 and an inorganic passivation layer 10 arranged on the thin film transistor 16 in sequence, in which the organic insulating layer 11 is arranged on the thin film transistor 16 and the inorganic passivation layer 10 is arranged on the organic insulating layer 11. At least a portion of the organic insulating layer 11 which is in contact with the inorganic passivation layer 10 is provided with a concave-convex structure, that is, the organic insulating layer 11 is arranged to be uneven at least at a portion of a surface directly in contact with the inorganic passivation layer 10.

For example, the concave-convex structure comprises a concave structure.

It should be noted that, the concave-convex structure refers to a structure deliberately arranged on the organic insulating layer according to the requirements, which is different from the unevenness that cannot be avoided because of precision of manufacturing process. The concave-convex structure is also distinguished from via hole structures for connection. The concave-convex structure includes the concave structure that recesses toward the base substrate, and/or includes a convex structure that protruding away from the base substrate. The concave-convex structure is the concave structure, or the convex structure, or a combination of the concave structure and the convex structure. The concave structure is concave relative to the whole of a flat surface, and the convex structure is protruding relative to the whole of the flat surface. The following takes the case that the concave-convex structure is the concave structure as an example, however the embodiments of the present disclosure are not limited thereto.

For example, the thin film transistor 16 is a bottom-gate type thin film transistor, a top-gate type thin film transistor, or a double-gate type thin film transistor. As illustrated in FIG. 3, taking the case that the thin film transistor is the bottom-gate type thin film transistor as an example, the thin film transistor includes: a gate electrode 6 coupled to the gate line 13 and arranged on the base substrate 7; a gate insulation layer 5 arranged on the gate line 13 and the gate electrode 6; an active layer 4 arranged on the gate insulation layer 5 and corresponding to the gate electrode 6; and a drain electrode 2 and a source electrode 3. The thin film transistor 16 acts as a switching element of the pixel region 15.

For example, the material of the gate insulation layer 5 includes at least one of silicon oxide and silicon nitride; the material of the active layer 4 includes at least one of amorphous silicon, metal oxide semiconductor, and organic semiconductor, etc.; the material of the drain electrode 2 and the source electrode 3 includes copper, copper alloys, aluminum, aluminum alloy, molybdenum, molybdenum alloy or other suitable materials.

For example, the base substrate 7 includes a transparent insulating substrate, the material of the base substrate 7 includes glass, quartz, plastic or other suitable material.

For example, two gate lines 13 cross with two data lines 14 to define the pixel region 15. FIG. 2 only shows two gate lines 13 and one data line 14 as an example, a plurality of gate lines 13 and a plurality of data lines 14 may be arranged on the base substrate 7. The gate line 13 includes a plurality of gate electrodes 16 branched from thereon, and the gate signal is applied to the gate electrodes 16 by the gate line 13.

For example, a material of the gate line 13 and the data line 14 includes copper, a copper alloy, aluminum, an aluminum alloy, molybdenum, a molybdenum alloy or other suitable material.

For example, as illustrated in FIG. 2 and FIG. 3, the organic insulating layer 11 is arranged on the active layer 4, the drain electrode 2 and the source electrode 3, a via hole structure 12 for electrical connection is arranged in the organic insulating layer 11, and a first electrode 9 is electrically coupled to the drain electrode 2 by the via hole structure 12.

For example, as illustrated in FIG. 3, the source electrode 3 of the thin film transistor is electrically coupled with the data line 14 or is integrally formed with the data line 14.

For example, at least the portion of the organic insulating layer 11 which is in contact with the inorganic passivation layer 10 and at a peripheral region of the via hole structure 12 is provided with the concave structure. For example, the concave structure is arranged at least in the region surrounded by the dotted frame in FIG. 3. It should be noted that, the peripheral region of the via hole structure 12 refers to the region between two adjacent via hole structures in the organic insulating layer.

For example, a portion of the organic insulating layer 11 which is in contact with the first electrode 9 is provided with the concave structure, in this way, the adhesion between the first electrode 9 and the organic insulating layer 11 is enhanced.

For example, the concave structure is arranged at a preset distance from the via hole structure 12. For example, the preset distance is half of a distance between two adjacent via hole structures in the organic insulating layer, or for example, the preset distance is ⅓ of the distance between the two adjacent via hole structures in the organic insulating layer.

For example, a shape of a longitudinal section, which is perpendicular to the base substrate 11, of the concave structure comprises at least one of a semi-circle, a semi-ellipse, a rectangle and a trapezoid.

Figure 4:
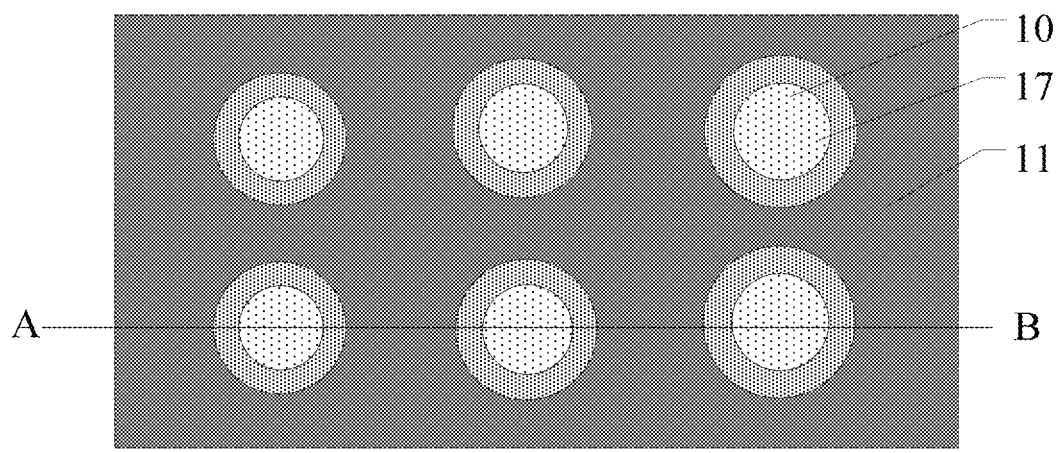
FIG. 4 is a schematic diagram of a perspective structure of an organic insulating layer and an inorganic passivation layer provided by at least one embodiment of the present disclosure.
Figure 5:
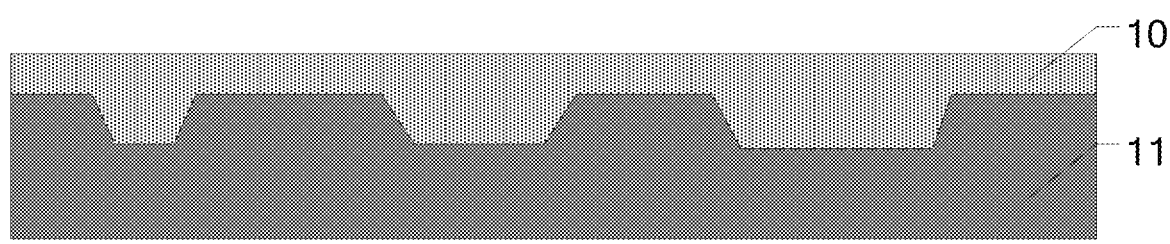
FIG. 5 is a schematic diagram of a longitudinal section structure taken along line A-B in FIG. 4.

For example, FIG. 4 is a schematic diagram of a perspective structure of the organic insulating layer and the inorganic passivation layer provided by at least one embodiment of the present disclosure; and FIG. 5 is a schematic diagram of a longitudinal section structure along line A-B taken along in FIG. 4. As illustrated in FIG. 4 and FIG. 5, a shape of a horizontal section, which is parallel to the base substrate 11, of the concave structure 17 is a circle, and the concave structure 17 increases the contact area between the organic insulating layer and the inorganic passivation layer, thereby the stress of the inorganic passivation layer is released, and further the phenomenon that the inorganic passivation layer falls off is reduced or eliminated.

For example, as illustrated in FIG. 4, a plurality of the concave structures 17 are evenly arranged on the surface of the organic insulating layer 11 directly in contact with the inorganic passivation layer 10, that is, the concave structures 17 are evenly spaced from each other on the surface of the organic insulating layer 11 directly in contact with the inorganic passivation layer 10.

For example, as illustrated in FIG. 4, the farther the concave structures 17 are from the via hole structure 12, the larger areas of the horizontal sections, which are parallel to the base substrate 7, of the concave structures 17 are. That is, in FIG. 4, from left to right, the areas of the horizontal sections of the concave structures are increased gradually.

Figure 6:
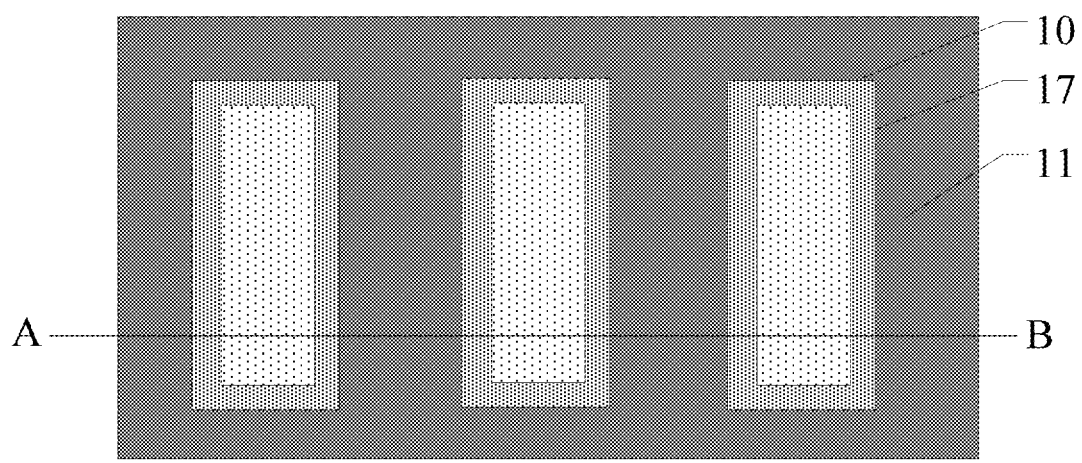
FIG. 6 is another schematic diagram of the perspective structure of the organic insulating layer and the inorganic passivation layer provided by at least one embodiment of the present disclosure.
Figure 7:
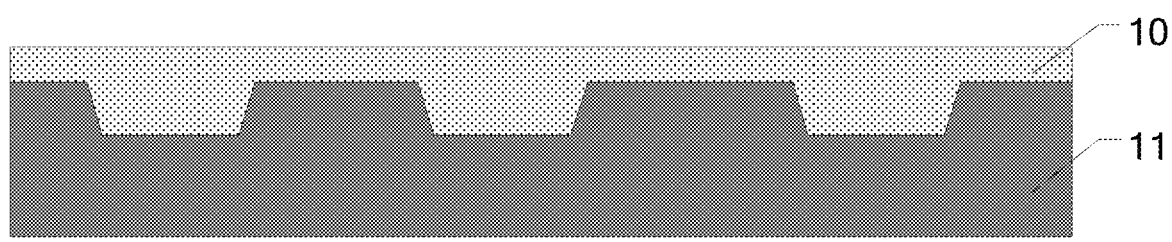
FIG. 7 is a schematic diagram of a longitudinal section structure taken along line A-B in FIG. 6.

For example, FIG. 6 is another schematic diagram of the perspective structure of the organic insulating layer and the inorganic passivation layer provided by at least one embodiment of the present disclosure; and FIG. 7 is a schematic diagram of a longitudinal section structure taken along line A-B in FIG. 6. As illustrated in FIG. 6 and FIG. 7, the shape of the horizontal section, which is parallel to the base substrate 7, of the concave structure 17 is a rectangle, the shape of the longitudinal section, which is perpendicular to the base substrate 7, of the concave structure 17 is a trapezoid, and the concave structure 17 increases the contact area between the organic insulating layer and the inorganic passivation layer, thereby the stress of the inorganic passivation layer is released, and further the phenomenon that the inorganic passivation layer falls off is reduced or eliminated.

For example, as illustrated in FIG. 6 and FIG. 7, the farther the concave structures are from the via hole structure, the greater a density of the concave structures (a number of the concave structures in per unit area) is. In FIG. 6 and FIG. 7, from left to right, the density of the concave structures is increased gradually. The existence of the via hole structure reduces the risk that the inorganic passivation layer falls off, and the greater the distance from the via structure is, the greater possibility that the inorganic passivation layer falls off. The contact area of the organic insulating layer and the inorganic passivation layer is increased by increasing the density of concave structures in the region farther away from the via hole structure, in this way, the phenomenon that the inorganic passivation layer falls off is reduced or eliminated.

Figure 8:
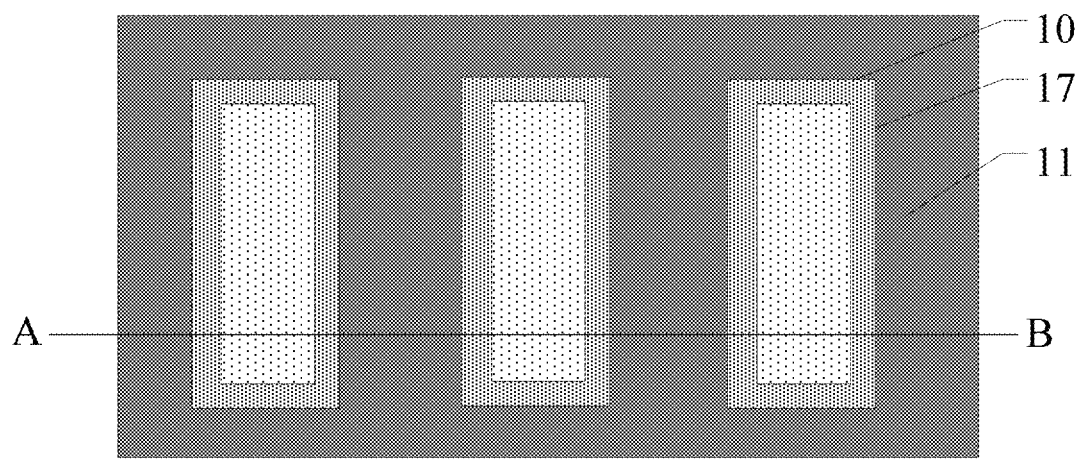
FIG. 8 is still another schematic diagram of the perspective structure of the organic insulating layer and the inorganic passivation layer provided by at least one embodiment of the present disclosure.
Figure 9:
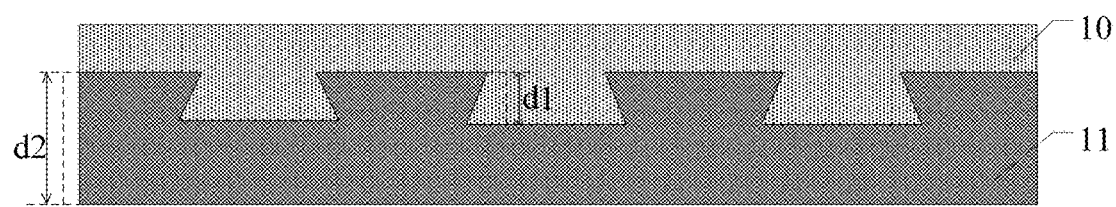
FIG. 9 is a schematic diagram of a longitudinal section structure taken along line A-B in FIG. 8.

For example, FIG. 8 is still another schematic diagram of the perspective structure of the organic insulating layer and the inorganic passivation layer provided by at least one embodiment of the present disclosure; and FIG. 9 is a schematic diagram of a longitudinal section structure taken along line A-B shown in FIG. 8. For example, in the structure illustrated in FIG. 8, the horizontal section, which is parallel to the base substrate 7, of the concave structure is a rectangle, the longitudinal section, which is perpendicular to the base substrate 7, of the concave structure is an inverted trapezoid, which further increases the contact area between the passivation layer and the organic insulating layer. The possibility of the passivation layer falling off from the organic insulating layer is reduced.

For example, the shapes of the horizontal sections of the concave structures are different from each other, the shapes of the longitudinal sections of the concave structures are different from each other.

For example, a thickness of the organic insulating layer is about 1 micrometer to 3 micrometer, for example, the thickness of the organic insulating layer is 1 micrometer, 1.5 micrometer, 2 micrometer or 3 micrometer. The via hole structure penetrates through the organic insulating layer 11, a ratio of a size of the concave structure 17 in a direction perpendicular to the base substrate to a size of the via hole structure in the direction perpendicular to the base substrate is from ¼ to ½, that is, the ratio of a depth of the concave structure 17 to a depth of the via hole structure is ¼ to ½. As illustrated in FIG. 9, the size of the concave structure 17 in the direction perpendicular to the base substrate is d1; the size of the via hole structure in the direction perpendicular to the base substrate is the thickness of organic insulating layer 11, and the size of the via hole structure in the direction perpendicular to the base substrate is d2. For example, the depth of the via hole structure 12 is 1 micrometer to 3 micrometer, the depth of the concave structure 17 is 0.25 micrometer to 1.5 micrometer, for example, the depth of the concave structure 17 is 0.25 micrometer, 1 micrometer, 1.25 micrometer or 1.5 micrometer. The concave structure is designed as the above sizes to increase the contact area between the passivation layer and the organic insulating layer, and further to reduce the capacitance between the electrodes, between the electrode and the electrode line, or between the electrode lines.

For example, a material of the organic insulating layer 11 includes at least one of polyimide, tetrafluoroethylene-perfluoroalkoxy vinyl ether copolymer, acrylic resin and polybutylene terephthalate.

For example, a material of the inorganic passivation layer 10 includes at least one of silicon nitride, silicon oxide, titanium dioxide and aluminum trioxide.

For example, as illustrated in FIG. 3, the substrate 01 further includes a second electrode 8 arranged on the inorganic passivation layer 10, in this way, the first electrode 9 is a pixel electrode, and the second electrode 8 is a common electrode.

For example, the first electrode 9 and the second electrode 8 are made of a transparent conductive material or a metal material. For example, the transparent conductive material includes indium tin oxide (ITO), indium zinc oxide (IZO), indium gallium oxide (IGO), zinc gallium oxide (GZO)), zinc oxide (ZnO), Indium oxide ($In_2O_3$), aluminum zinc oxide (AZO) or carbon nanotubes, and the metal material includes silver or aluminum.

At least one embodiment of the present disclosure further provides a display panel, and the display panel includes any one of the substrates described above.

For example, the substrate is used in a liquid crystal display panel, an organic light-emitting diode display panel, an electronic paper display panel, etc.

Figure 10:
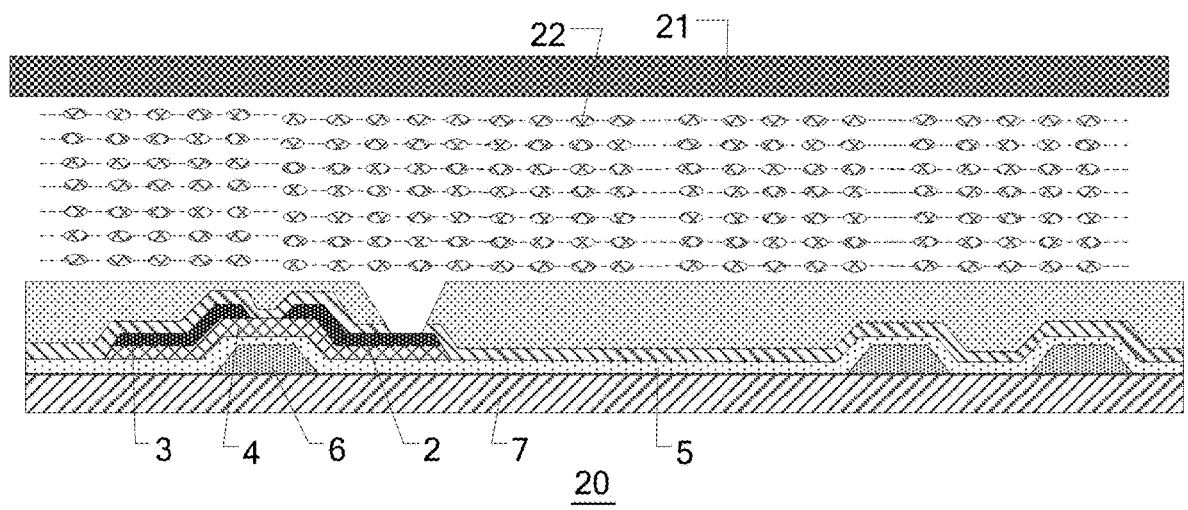
FIG. 10 is a schematic diagram of a sectional structure of a display panel provided by at least one embodiment of the present disclosure.

FIG. 10 is a schematic diagram of a sectional structure of the display panel provided by at least one embodiment of the present disclosure. For example, the liquid crystal display panel is taken as an example of the display panel, as illustrated in FIG. 10, the display panel 20 includes any one of the above mentioned substrates 01, an opposite substrate 21 arranged parallel to the base substrate 7 and liquid crystal molecule layer 22 arranged between the substrate 01 and the opposite substrate 21. For example, the substrate 01 is an array substrate, the opposite substrate 21 is a color filter substrate, the array substrate and the color filter substrate 21 are positioned opposite to each other to form a liquid crystal cell.

For example, in a case that the display panel is the organic light-emitting diode display panel, a stack of organic light-emitting materials is further formed on the substrate. For example, the stack of the organic light-emitting materials includes a hole injection layer, a hole transport layer, an organic light-emitting layer, an electron transport layer and an electron injection layer. The pixel electrode of the pixel region is used as an anode or a cathode to drive the organic light-emitting material layer to emit light and thus to perform the display operation.

For example, in a case that the display panel is the electronic paper display panel, an electronic ink layer is further formed on the substrate, and the pixel electrode of the pixel region is used for applying a voltage for driving the charged microparticles in the electronic ink layer to move to perform the display operation.

Figure 11:
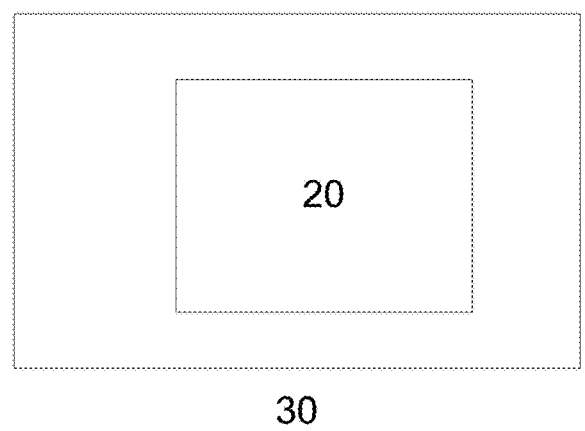
FIG. 11 is a block diagram of a display device provided by at least one embodiment of the present disclosure.

At least one embodiment of the present disclosure further provides a display device, and the display device includes any one of the display panels described above. For example, FIG. 11 is a block diagram of the display device provided by at least one embodiment of the present disclosure. As illustrated in FIG. 11, the display device 30 includes the display panel 20.

An example of the display device 30 is a liquid crystal display device, in which the substrate and the opposite substrate are arranged opposite to each other to form the liquid crystal cell in which the liquid crystal material layer is filled. For example, the opposite substrate is the color filter substrate, the substrate is the array substrate, and the pixel electrode of the pixel region of the array substrate is used for controlling the degree of rotation of the liquid crystal material by applying an electric field so as to perform the display operation. In some examples, the liquid crystal display device also includes a backlight source that provides backlight to the array substrate.

Another example of the display device 30 is an organic light-emitting diode display device (OLED), the stack of the organic light-emitting materials is further formed on the substrate. The pixel electrode of the pixel region is used as the anode or the cathode to drive the organic light-emitting material to emit light and thus to perform the display operation.

Another example of the display device 30 is an electronic paper display device, the electronic ink layer is further formed on the substrate, and the pixel electrode of the pixel region is used for applying the voltage for driving the charged microparticles in the electronic ink layer to move to perform the display operation.

For example, other structures in the display device 30 may be referred to a conventional design. For example, the display device is any product or component having a display function such as a mobile phone, a tablet computer, a television, a display, a notebook computer, a digital photo frame, a navigator and the like. Other essential components of the display device are understood by ordinary technicians in the art are included, which is omitted here, and is not be used as a limitation to the present disclosure. The embodiments of the display device may be referred to the above embodiments of the display panel, and detailed descriptions will be omitted herein.

Figure 12:
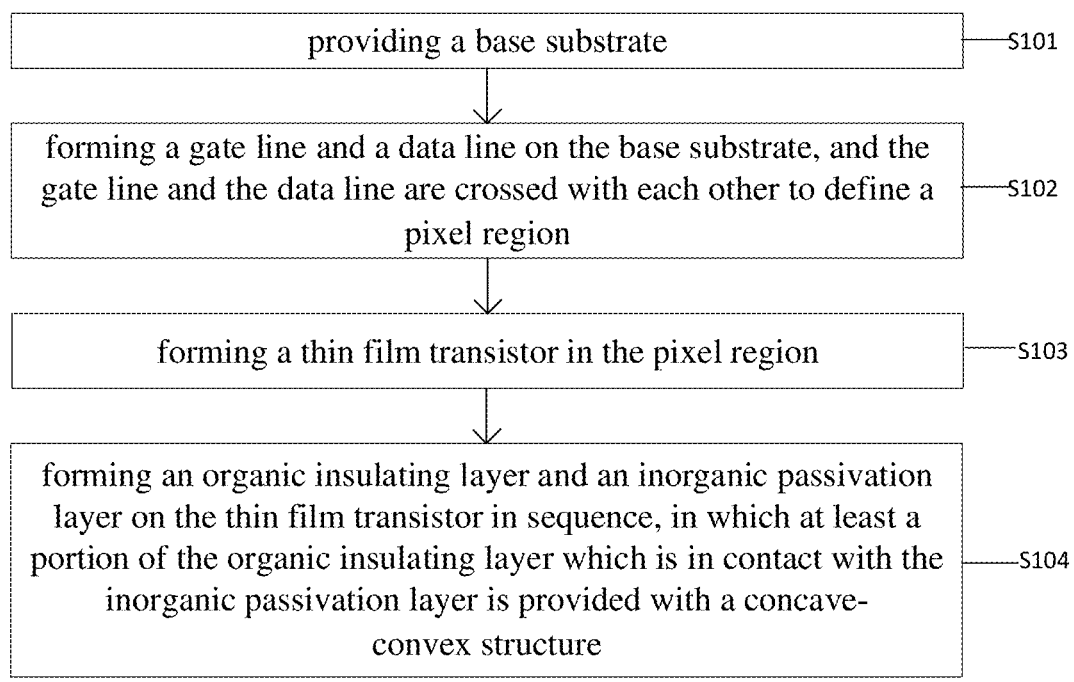
FIG. 12 is a flow diagram of a manufacturing method of a substrate provided by at least one embodiment of the present disclosure.

At least one embodiment of the present disclosure further provides a manufacturing method of a substrate. For example, FIG. 12 is a flow diagram of the manufacturing method of the substrate provided by at least one embodiment of the present disclosure, and the manufacturing method includes the following steps.

S101: providing a base substrate;

For example, the base substrate is a transparent insulating substrate, and the material of the base substrate is glass, quartz, plastic or other suitable material.

S102: forming a gate line and a data line on the base substrate, and the gate line and the data line are crossed with each other to define a pixel region;

For example, two gate lines and two data lines are crossed with each other to define the pixel region. The gate lines includes a plurality of gate electrodes branched from thereon, and the gate signal is applied to the gate electrodes by the gate line.

For example, the material of the gate line and the data line includes copper, a copper alloy, aluminum, an aluminum alloy, molybdenum, a molybdenum alloy or other suitable material.

S103: forming a thin film transistor in the pixel region;

For example, the thin film transistor is a bottom-gate type thin film transistor, a top-gate type thin film transistor, or a double-gate type thin film transistor. Taking the case that the thin film transistor is the bottom-gate type thin film transistor as an example, the thin film transistor includes: a gate electrode coupled to the gate line and disposed on the base substrate; a gate insulation layer disposed on the gate line and the gate electrode; an active layer disposed on the gate insulation layer and correspond to the gate electrode; and a source electrode and a drain electrode, and the thin film transistor is a switching element of the pixel region.

For example, the material of the gate insulation layer includes at least one of silicon oxide and silicon nitride; the material of the active layer includes at least one of amorphous silicon, metal oxide semiconductor and organic semiconductor, etc.; the material of the source electrode and the drain electrode includes at least one of copper, copper alloys, aluminum, aluminum alloys, molybdenum, molybdenum alloys and other suitable materials.

S104: forming an organic insulating layer and an inorganic passivation layer on the thin film transistor in sequence, in which at least a portion of the organic insulating layer which is in contact with the inorganic passivation layer is provided with a concave-convex structure.

It should be noted that, the concave-convex structure refers to a structure deliberately arranged on the organic insulating layer according to the requirements, which is different from the unevenness that cannot be avoided because of precision of manufacturing process. The concave-convex structure is also distinguished from via hole structures for connection. The concave-convex structure includes a concave structure that recesses toward the base substrate, and/or includes a convex structure that protruding away from the base substrate. The concave-convex structure is the concave structure, or the convex structure, or a combination of the concave structure and the convex structure. The concave structure is concave relative to the whole of a flat surface, and the convex structure is protruding relative to the whole of the flat surface. The following takes the case that the concave-convex structure is the concave structure as an example, however the embodiments of the present disclosure are not limited thereto.

For example, a shape of a longitudinal section, which is perpendicular to the base substrate, of the concave structure comprises at least one of a semi-circle, a semi-ellipse, a rectangle and a trapezoid. A shape of the horizontal section, which is perpendicular to the base substrate, of the concave structure includes at least one of a circle and a rectangle.

For example, the manufacturing method further includes forming a via hole structure for electrical connection in the organic insulating layer, at least a portion of the organic insulating layer which is in contact with the inorganic passivation layer and at a peripheral region of the via hole structure is provided with the concave structure.

For example, the concave structure is arranged at a preset distance from the via hole structure 12. For example, the preset distance is half of a distance between two adjacent via hole structures in the organic insulating layer, or for example, the preset distance is ⅓ of the distance between the two adjacent via hole structures in the organic insulating layer.

For example, the plurality of the concave structures are evenly arranged on a surface of the organic insulating layer directly in contact with the inorganic passivation layer, that is, the concave structures are evenly spaced from each other on the surface of the organic insulating layer directly in contact with the inorganic passivation layer.

For example, the farther the concave structures are from the via hole structure, the larger areas of the horizontal sections, which are parallel to the base substrate, of the concave structures are.

For example, the material of the organic insulating layer includes at least one of polyimide, tetrafluoroethylene-perfluoroalkoxy vinyl ether copolymer, acrylic resin and polybutylene terephthalate.

For example, the material of the inorganic passivation layer includes at least one of silicon nitride, silicon oxide, titanium dioxide and aluminum oxide.

For example, the process of forming the organic insulating layer on the thin film transistor includes: coating an organic insulating film on the thin film transistor; coating a photoresist on the organic insulating film; exposing and developing the photoresist by a mask plate.

For example, exposing the photoresist includes full exposure and grayscale exposure to the photoresist. A pattern of the organic insulating layer is formed after the full exposure, the grayscale exposure and the development, and the pattern of the organic insulating layer includes the via hole structure and the concave structure provided at the peripheral region of the via hole structure.

For example, a thickness of coated photoresist is 2 micrometer to 3 micrometer. For example, 2 micrometer, 2.5 micrometer, or 3 micrometer.

For example, the process of forming the organic insulating layer further includes drying the organic insulating layer so that the organic insulating layer is cured.

For example, an inorganic passivation layer film is deposited by a plasma enhanced chemical vapor deposition method or a sputtering method, and then a pattern of the inorganic passivation layer is formed by a patterning process.

The substrate and its manufacturing method, the display panel and the display device provided by the embodiments of the present disclosure have at least one of the following beneficial effects:

(1) in the substrate provided by at least one embodiment of the present disclosure, at least the portion of the organic insulating layer which is in contact with the inorganic passivation layer is provided with the concave-convex structure to increase the contact area between the inorganic passivation layer and the organic insulating layer, in this way, the internal stress of the inorganic passivation layer which is easy to cause cracks of the inorganic passivation layer is released;

(2) in the substrate provided by at least one embodiment of the present disclosure, the phenomenon that the inorganic passivation layer falls off is reduced or eliminated.

Please note that:

(1) the drawings of the embodiments of the present disclosure are only related to the structures mentioned in the embodiments of the present disclosure, and other structures can be obtained by general designs;

(2) for the sake of clarity, sizes of layers or regions in the drawings for describing the embodiments of the present disclosure are not drawn according to an actual scale but are exaggerated or diminished; and (3) the embodiments of the present disclosure and the features therein can be combined with each other in the absence of conflict.

What are described above is related to only the illustrative embodiments of the disclosure and not limitative to the scope of the disclosure. The scopes of the disclosure are defined by the accompanying claims.

What is claimed is:

1. A substrate, comprising:
a base substrate;
a thin film transistor disposed on the base substrate;
an organic insulating layer disposed on the thin film transistor;
an inorganic passivation layer disposed on the organic insulating layer; and
a first electrode arranged between the organic insulating layer and the inorganic passivation layer,
wherein only the organic insulating layer is provided with a via hole structure for electrical connection, and at least a portion of the organic insulating layer which is in contact with the inorganic passivation layer and at a peripheral region of the via hole structure is provided with a concave-convex structure,
the inorganic passivation layer is arranged on a side of the first electrode away from the organic insulating layer,
a surface of the organic insulating layer away from the base substrate is in direct contact with the first electrode, and a portion of the organic insulating layer in contact with the first electrode is provided with the concave-convex structure, and
the concave-convex structure comprises a plurality of concave structures, the farther the concave structures are from the via hole structure, the smaller a distance between adjacent concave structures and the greater a density of the concave structures is, and the larger areas of horizontal sections, which are parallel to the base substrate, of the concave structures are.

2. The substrate according claim 1, wherein the via hole structure penetrates through the organic insulating layer, a ratio of a size of any one of the concave structures in a direction perpendicular to the base substrate to a size of the via hole structure in the direction perpendicular to the base substrate is from ¼ to ½.

3. The substrate according to claim 1, wherein a shape of a longitudinal section, which is perpendicular to the base substrate, of any one of the concave structures comprises at least one of a semi-circle, a semi-ellipse, a rectangle, or a trapezoid.

4. The substrate according to claim 3, wherein the first electrode is electrically coupled with a drain electrode of the thin film transistor by the via hole structure.

5. The substrate according to claim 1, wherein a material of the organic insulating layer comprises at least one of polyimide, tetrafluoroethylene-perfluoroalkoxy vinyl ether copolymer, acrylic resin, or polybutylene terephthalate.

6. The substrate according to claim 4, further comprising: a second electrode arranged on the inorganic passivation layer, wherein the first electrode is a pixel electrode, and the second electrode is a common electrode.

7. The substrate according to claim 1, further comprising: a gate line and a data line arranged on the base substrate, wherein the gate line and the data line are intersected with each other to define a pixel region, and the thin film transistor is arranged in the pixel region.

8. A display panel, comprising a substrate, wherein the substrate comprises:
a base substrate;
a thin film transistor disposed on the base substrate;
an organic insulating layer disposed on the thin film transistor;
an inorganic passivation layer disposed on the organic insulating layer; and
a first electrode arranged between the organic insulating layer and the inorganic passivation layer,
wherein only the organic insulating layer is provided with a via hole structure for electrical connection, and at least a portion of the organic insulating layer which is in contact with the inorganic passivation layer and at a peripheral region of the via hole structure is provided with a concave-convex structure,
the inorganic passivation layer is arranged on a side of the first electrode away from the organic insulating layer,
a surface of the organic insulating layer away from the base substrate is in direct contact with the first electrode, and a portion of the organic insulating layer in contact with the first electrode is provided with the concave-convex structure, and the concave-convex structure comprises a plurality of concave structures, the farther the concave structures are from the via hole structure, the smaller a distance between adjacent concave structures and the greater a density of the concave structures is, and the larger areas of horizontal sections, which are parallel to the base substrate, of the concave structures are.

9. A display device, comprising the display panel according to claim 8.

10. A manufacturing method of a substrate, comprising:
providing a base substrate;
forming a thin film transistor on the base substrate;
forming an organic insulating layer on the thin film transistor;
forming an inorganic passivation layer on the organic insulating layer; and
forming a first electrode between the organic insulating layer and the inorganic passivation layer,
wherein only the organic insulating layer is provided with a via hole structure for electrical connection, and at least a portion of the organic insulating layer which is in contact with the inorganic passivation layer and at a peripheral region of the via hole structure is provided with a concave-convex structure, the inorganic passivation layer is arranged on a side of the first electrode away from the organic insulating layer, a surface of the organic insulating layer away from the base substrate is in direct contact with the first electrode, and a portion of the organic insulating layer in contact with the first electrode is provided with the concave-convex structure, and the concave-convex structure comprises a plurality of concave structures, the farther the concave structures are from the via hole structure, the smaller a distance between adjacent concave structures and the greater a density of the concave structures is, and the larger areas of horizontal sections, which are parallel to the base substrate, of the concave structures are.

11. The manufacturing method according to claim 10, further comprising:
forming a gate line and a data line on the base substrate, wherein the gate line and the data line are intersected with each other to define a pixel region, and the thin film transistor is arranged in the pixel region.

* * * * *